US010847910B1

(12) United States Patent
Amini et al.

(10) Patent No.: US 10,847,910 B1
(45) Date of Patent: Nov. 24, 2020

(54) FLOATING BOARD-TO-BOARD CONNECTORS

(71) Applicants: Mahmoud R. Amini, Sunnyvale, CA (US); James E. Harper, Paso Robles, CA (US)

(72) Inventors: Mahmoud R. Amini, Sunnyvale, CA (US); James E. Harper, Paso Robles, CA (US)

(73) Assignee: APPLE INC., Cupertino, CA (US)

(*) Notice: Subject to any disclaimer, the term of this patent is extended or adjusted under 35 U.S.C. 154(b) by 357 days.

(21) Appl. No.: 15/803,887

(22) Filed: Nov. 6, 2017

Related U.S. Application Data

(60) Provisional application No. 62/518,174, filed on Jun. 12, 2017, provisional application No. 62/456,851, filed on Feb. 9, 2017.

(51) Int. Cl.
*G01C 3/08* (2006.01)
*H01R 12/73* (2011.01)
*G01S 7/481* (2006.01)
*H05K 5/02* (2006.01)
*H01R 12/91* (2011.01)

(52) U.S. Cl.
CPC ............ *H01R 12/737* (2013.01); *G01S 7/481* (2013.01); *H01R 12/91* (2013.01); *H05K 5/0217* (2013.01)

(58) Field of Classification Search
CPC .... H01R 12/737; H01R 12/91; H05K 5/0217; G01S 7/481
See application file for complete search history.

(56) References Cited

U.S. PATENT DOCUMENTS

| 9,515,439 | B2 | 12/2016 | Ng et al. | |
|---|---|---|---|---|
| 9,537,263 | B2 | 1/2017 | Gao et al. | |
| 2010/0330833 | A1* | 12/2010 | Wang | H05K 3/0097 439/325 |
| 2014/0342577 | A1* | 11/2014 | De Bruijn | H01R 43/16 439/31 |

* cited by examiner

*Primary Examiner* — Samantha K Abraham
*Assistant Examiner* — Kimberly Jasmin Ramsarup
(74) *Attorney, Agent, or Firm* — Young Basile Hanlon & MacFarlane, P.C.

(57) ABSTRACT

A LIDAR sensor assembly includes a main board, a board-to-board connector assembly, and a sensor component board. The main board has an edge. The board-to-board connector assembly is located on the main board and includes a housing. The housing includes a feature that aligns an angular orientation of the housing relative to the main board by engagement of the feature of the housing with the edge of the main board. The board-to-board connector also includes connector pins that are connected to the main board and are disposed within the housing. The sensor component board is connected to the main board by the connector pins of the board-to-board connector assembly to allow pivoting of the sensor component board relative to the main board over a limited angular range.

23 Claims, 7 Drawing Sheets

FLOATING BOARD-TO-BOARD CONNECTORS

CROSS-REFERENCE TO RELATED APPLICATIONS

This application claims the benefit of U.S. Patent Application No. 62/456,851, filed on Feb. 9, 2017, and entitled "Floating Board-to-Board Connectors." This application also claims the benefit of U.S. Patent Application No. 62/518,174, filed on Jun. 12, 2017, and entitled "Floating Board-to-Board Connectors." The contents of the foregoing applications are incorporated by reference in their entireties herein.

TECHNICAL FIELD

The application relates generally to board-to-board connector assemblies.

BACKGROUND

Electrical components often include multiple interconnected circuit boards, such as printed circuit boards (PCB). A circuit board may be referred to herein as a "board." One method for connecting two circuit boards is to connect them with a wire harness. Another method for connecting two circuit boards is to connect them with a board-to-board connector, which directly connects two circuit boards without an intervening wire harness.

One example of a board-to-board connector assembly includes a first connector part having pin connectors on a first board and a second connecting part having receptacles on a second board, where the pins are received in the receptacles to define electrical connections between the first and second boards. Another example of a board-to-board connector assembly includes an edge connector defined by traces on an edge of a first board and a receptacle formed on a second board including sockets or spring fingers that engage the traces on the first board to define electrical connections between the first and second boards.

SUMMARY

One aspect of the disclosed embodiments is a LIDAR sensor assembly that includes a main board, a board-to-board connector assembly, and a sensor component board. The main board has an edge. The board-to-board connector assembly is located on the main board and includes a housing. The housing includes a feature that aligns an angular orientation of housing relative to the main board by engagement of the feature of the housing with the edge of the main board. The board-to-board connector also includes connector pins that are connected to the main board and are disposed within the housing. The sensor component board is connected to the main board by the connector pins of the board-to-board connector assembly to allow pivoting of the sensor component board relative to the main board over a limited angular range.

Another aspect of the disclosed embodiments is a LIDAR sensor assembly that includes a main board, a board-to-board connector assembly, and a sensor component board. The board to board connector assembly is located on the main board and includes a housing and a pin assembly. The housing is connected to the main board. An internal bay is defined inside the housing, the internal bay has an upper internal wall, the internal bay has a lower internal wall, and the internal bay has an intermediate wall. The pin assembly is connected to the main board and is disposed within the housing. The pin assembly includes upper pins, the pin assembly includes lower pins, the upper pins are positioned adjacent to the upper internal wall, and the lower pins are positioned adjacent to the lower internal wall. The sensor component board is connected to the main board by the pin assembly of the board-to-board connector assembly. The sensor component board has an upper surface, the sensor component board has a lower surface, the upper pins engage the upper surface of the sensor component board, and the lower pins engage the lower surface of the sensor component board.

Another aspect of the disclosed embodiments is a LIDAR sensor assembly that includes a main board, a board-to-board connector assembly, and sensor component boards. The board-to-board connector assembly is located on the main board and includes a housing and pin assemblies. The housing is connected to the main board. Internal bays are defined inside the housing. Each of the internal bays has an upper internal wall, each of the internal bays has a lower internal wall, and each of the internal bay has an intermediate wall. Pin assemblies are connected to the main board and are each disposed in within the housing in a respective one of the internal bays. Each of the pin assemblies includes upper pins and each of the pin assemblies includes lower pins. The upper pins are positioned adjacent to the upper internal wall of the respective one of the internal bays, and the lower pins are positioned adjacent to the lower internal wall of the respective one of the internal bays. The sensor component boards are each connected to the main board by a respective one of the pin assemblies of the board-to-board connector assembly. Each of the sensor component boards has an upper surface and each of the sensor component boards has a lower surface. The upper pins of each of the pin assemblies engage the upper surface of the respective sensor component board and the lower pins of each pin assembly engage the lower surface of the respective sensor component board.

DETAILED DESCRIPTION

In some applications, board-to-board connector assemblies are subject to size constraints, such as when multiple daughter boards are connected to a single main board and must be located within a small area. At the same time structural constraints, such as strength and alignment, pose challenges in small package sizes. Clearance and creepage constraints must also be considered, especially when high voltages are present and components are closely spaced. Clearance refers to the shortest distance between two electrical components. Creepage refers to the shortest path between two electrical components across the surface of an insulator.

Sensor applications can impose an additional need to align sensor components subsequent to connection of the sensor components to another portion of the system. For example, sensor alignment considerations may dictate a need to adjust a sensing component by, for example, one degree in each of multiple linear and rotational directions.

The systems and methods described herein relate to board-to-board connector assemblies that perform well in small package sizes while allowing adjustment of sensor components. For example, the connectors can include housings that are able to pivot slightly relative to a main board, and may also allow adjustment of the individual sensor components relative to the housings. The board-to-board connector assemblies described herein are well-suited to sensor applications in which components are located on daughter boards that are connected to one or more main boards.

Figure 1:
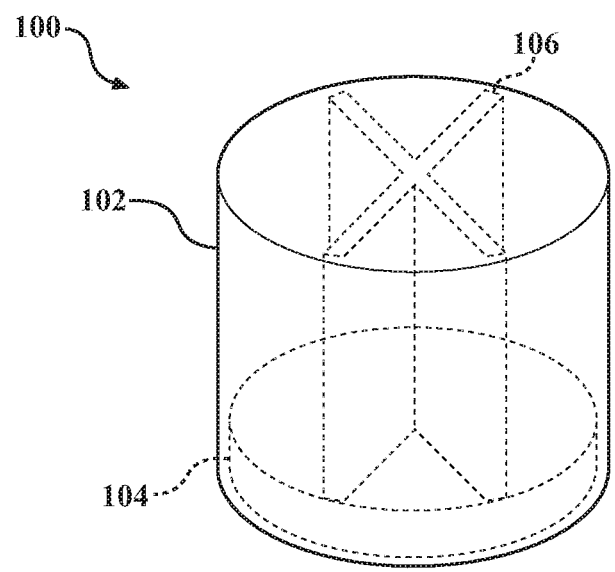
FIG. 1 is an illustration that shows a sensor unit.

FIG. 1 is an illustration that shows a sensor unit 100. In the illustrated example, the sensor unit 100 is a LIDAR sensor unit that emits rapid pulses of laser light, senses reflected laser light, and determines distances by measuring the amount of time elapsed between emission and return of the laser light. The sensor unit 100 includes a housing 102, control electronics 104, and a sensor array 106. At least part of the housing 102 is transparent to electromagnetic radiation at wavelengths that correspond to laser light to allow laser light pulses to exit the housing 102 and return to the housing 102. The control electronics 104 can include components that supply power to the sensor array 106, receive sensor output signals from the sensor array 106, process the sensor output signals and transmit the sensor output signals to another system by a wired or wireless communications connection, and rotate the sensor array 106 within the housing 102. By rotating the sensor array 106 within the housing 102, a small number of sensor components can generate a large number of measurements that are disposed in an array that corresponds to a field of view of the sensor unit 100. In some implementations, the control electronics 104 rotate the sensor array 106 continuously around an axis to define a three hundred and sixty-degree field of view for the sensor unit 100.

The sensor array 106 can include a plurality of sensor assemblies. The sensor assemblies can be positioned in an upstanding fashion and can be oriented at an equal angular spacing, with their sensing components facing radially outward relative to the housing 102. In the illustrated example, the sensor array 106 includes four sensor assemblies that are connected together with their sensing components oriented at a ninety-degree angular spacing.

Figure 2:
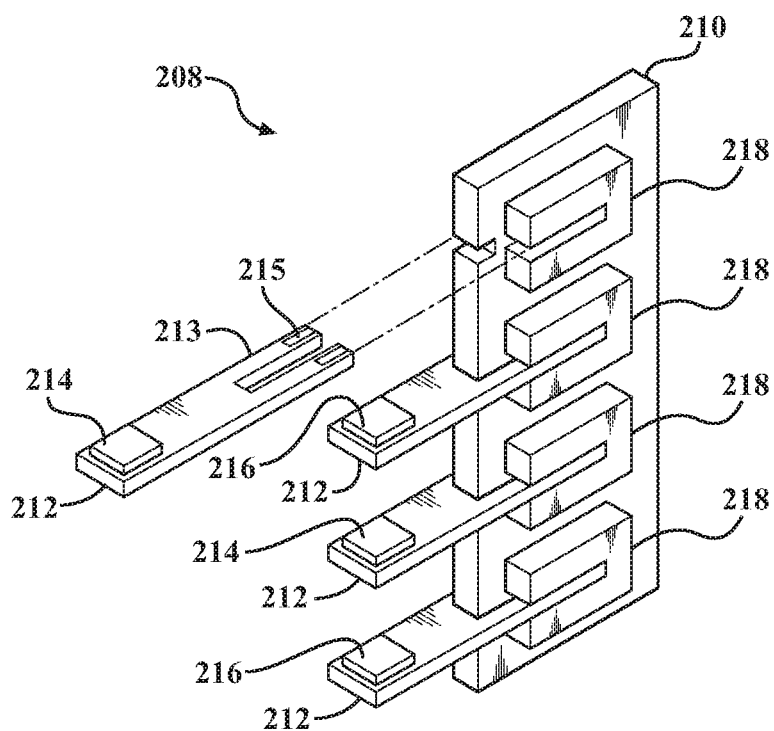
FIG. 2 is an illustration that shows a sensor assembly that can be incorporated in a sensor array of the sensor unit.

FIG. 2 is an illustration that shows a sensor assembly 208 that can be incorporated in the sensor array 106 of the sensor unit 100. The sensor assembly 208 includes a main board 210 and multiple sensor component boards 212. The main board 210 is a printed circuit board that includes components that connect the sensor component boards 212 to the control electronics 104 of the sensor unit 100. The main board 210 can also include devices that supply power to the sensor component boards 212 and/or receive and handle sensor output signals that are provided by the sensor component boards 212.

The sensor component boards 212 are circuit boards, such as printed circuit boards. The sensor component boards 212 each include electrical components that are electrically connected to the main board 210 using contact pads 215 that are formed on the sensor component boards 212. In the illustrated example, the sensor component boards 212 each include one of an emitter 214 or a receiver 216. The emitter 214 can be, for example, a laser. The receiver 216 can be, for example, a laser detector. In the illustrated example, four of the sensor component boards 212 are connected to the main board 210. Thus, in the context of the sensor unit 100 being a LIDAR sensor unit, the emitter 214 can be configured to emit a beam of laser light, and the receiver 216 can be configured to detect a reflected portion of the laser light, and output a signal that can be utilized to determine a distance by a time-of-flight calculation, and to determine an intensity based on the strength of the reflected laser light that is detected by the receiver 216.

The sensor component boards 212 each have a notched configuration or a Y-shaped configuration that is defined by two portions 213 that are spaced from one another by a slot. In the illustrated example, one of the contact pads 215 on the top surface of the sensor component boards 212 is located on each of the portions 213. Additional contact pads (not shown) may be formed on the bottom surface of each of the sensor component boards 212 on each of the portions 213.

The portions 213 of each of the sensor component boards 212 are located on opposite sides of the main board 210 with the main board 210 extending into the slot of each sensor component board 212 when the sensor component board 212 is connected to the main board 210. The notched configuration or the Y-shaped configuration of the sensor component boards 212 that is defined by the portions 213 can serve as a lateral alignment feature in that proper alignment is achieved for the sensor component boards 212 by restraining lateral motion of the sensor component boards 212 by engagement with both sides of the main board 210.

Each of the sensor component boards 212 is connected to the main board 210 by two connector assemblies 218, which are arranged in pairs on opposed sides of the main board 210. In the illustrated example, four of the connector assemblies 218 are shown, and an additional four of the connector assemblies 218 are obscured from view by the main board 210. As will be described herein, the connector assemblies 218 allow a small degree of angular adjustment of the sensor component boards 212 relative to the connector assemblies 218, which may be referred to herein as a "floating" connection. When the sensor component boards 212 are aligned as desired relative to the connector assemblies 218, the positions of the sensor component boards 212 can be fixed by conventional means such as by glue applied to the sensors component boards 212 and the connector assemblies 218.

Figure 3:
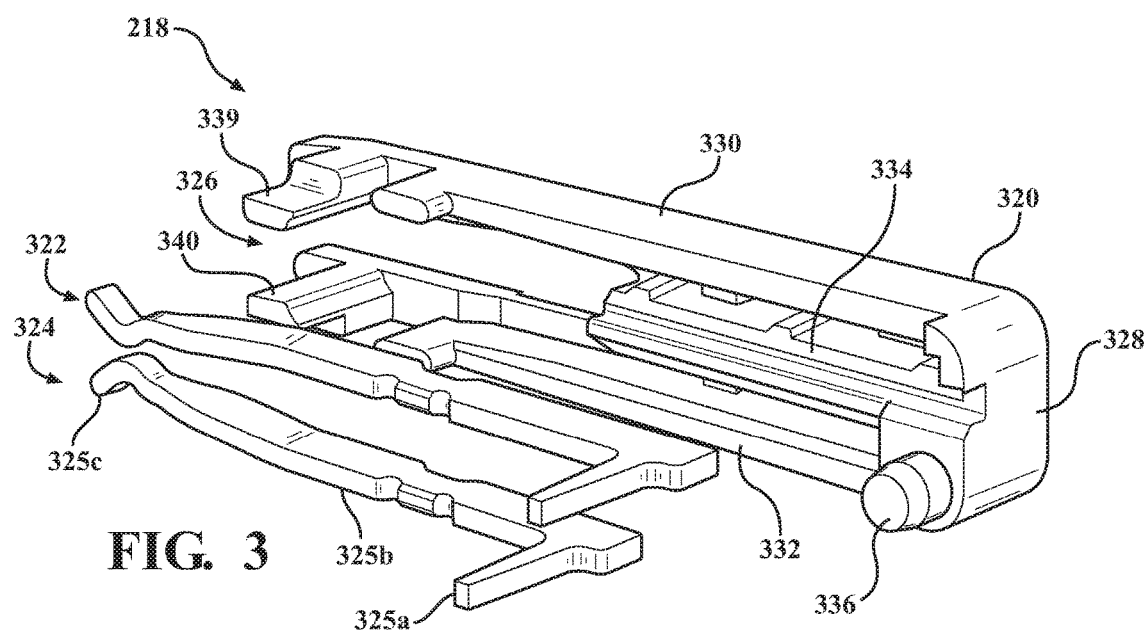
FIG. 3 is an exploded view that shows a connector assembly of the sensor assembly.

FIG. 3 is an exploded view of one of the connector assemblies 218 of the sensor assembly 208. The connector assembly 218 includes a housing 320, a first pin 322 and a second pin 324. The first pin 322 and the second pin 324 are electrical connector pins that are connected to the main board 210 and are disposed within the housing 320.

The first pin 322 and the second pin 324 are resilient, spring-like, flexible fingers that are configured to engage the sensor component boards 212 to define electrical connections to the main board 210. The first pin 322 may be referred to as an upper pin and the second pin 324 may be referred to as a lower pin. A laterally extending portion 325a of each of the first pin 322 and the second pin 324 is connected to the main board 210, such as by soldering. The laterally extending portion 325a of each of the first pin 322 and the second pin 324 can be the only portion of the first pin 322 and the second pin 324 that defines a fixed connection to the main board 210. As an example, the first pin 322 and the second pin 324 can be free from other connections to the main board 210 and can also lack fixed connections to the housing 320. Each of the first pin 322 and the second pin 324 also include a main portion 325b that extends in the longitudinal direction of the housing 320. The first pin 322 and the second pin 324 are connected to the main board 210 such that the laterally extending portions 325a space the main portions 325b of each of the first pin 322 and the second pin 324 from the main board 210. The main portion 325b of each of the first pin 322 and the second pin 324 extends from the laterally extending portion 325a to a tip portion 325c that is engageable with one of the contact pads 215 of one of the sensor component boards 212.

A tip portion of each of the first pin 322 and the second pin 324 can engage the sensor component boards 212 to secure the sensor component boards 212 relative to the connector assembly 218 by spring-loaded engagement of the first pin 322 and the second pin 324 with top and bottom surfaces, respectively, of the sensor component boards 212. The first pin 322 and the second pin 324 connect the sensor component boards 212 to the main board 210 in a manner that allows pivoting of the sensor component boards 212 relative to the main board 210 over a limited angular range. For example, an angular orientation of the sensor component boards 212 can be adjusted by deflection of the first pin 322 and the second pin 324, and can then be fixed using an adhesive or other structure that is able to restrain motion of the sensor component boards 212 relative to the main board 210. As will be described further herein, deflection of the first pin 322 and the second pin 324 can be limited, such as by engagement of the first pin 322 and the second pin 324 with the housing 320 such that the housing 320 limits pivoting of the sensor component board relative 212 to the main board 320 to the limited angular range.

Figure 4:
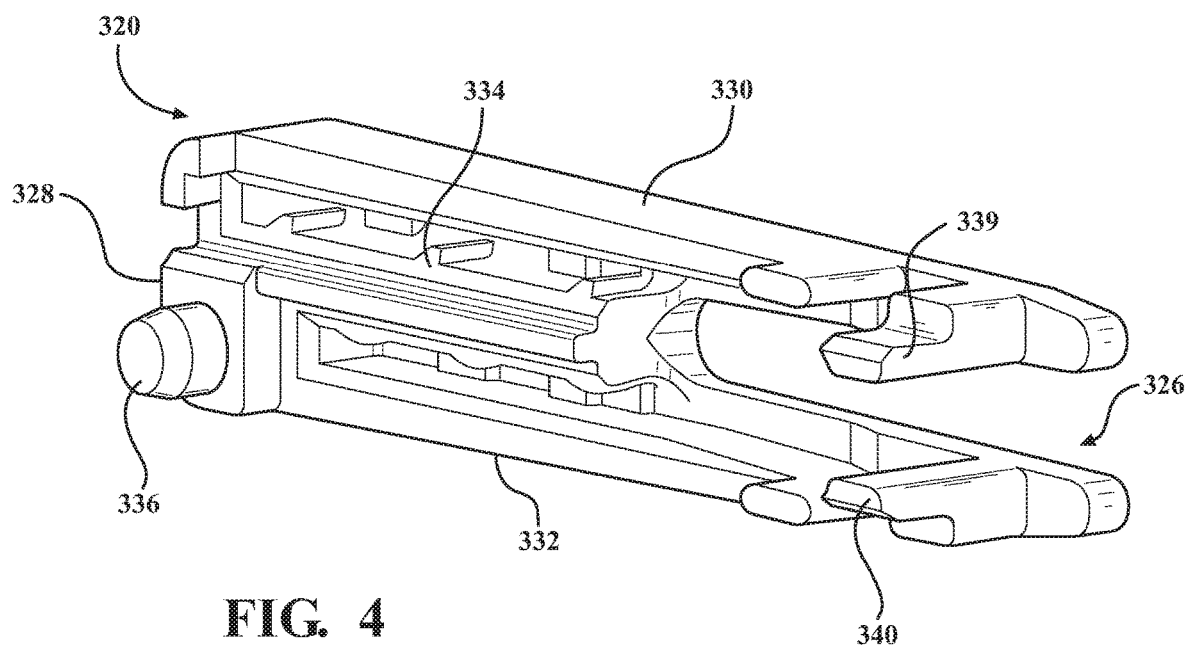
FIG. 4 is a perspective view of the housing of the connector assembly.

FIG. 4 is a perspective view of the housing 320. The housing 320 is made from a nonconductive material that can be rigid or slightly flexible. The housing 320 extends in a longitudinal direction from a first end 326 that defines an opening to a second end 328. The second end 328 is closed and interconnects an upper wall 330, a lower wall 332, and an intermediate wall 334. The upper wall 330 and the lower wall 332 may be referred to herein as an upper wall and a lower wall.

A mount 336, which can be a cylindrical post, extends laterally relative to the lower wall 332 near the second end 328 for connection to the main board 210 in a manner that allows angular alignment of the housing 320 relative to the main board 210 subject to constraints resulting from connection of the first pin 322 and the second pin 324 to the main board 210 as well as interaction of parts of the housing 320 with the main board 210. A first lateral projection 339 (upper lateral projection) and a second lateral projection 340 (lower lateral projection) are formed at the first end 326 and are engageable with features of an edge of the main board 210, such as notches formed on the edge of the main board 210, to align an angular orientation of the housing 320 relative to the main board 210 and to limit deflection of the upper wall 330 and the lower wall 332 of the housing 320.

Figure 5:
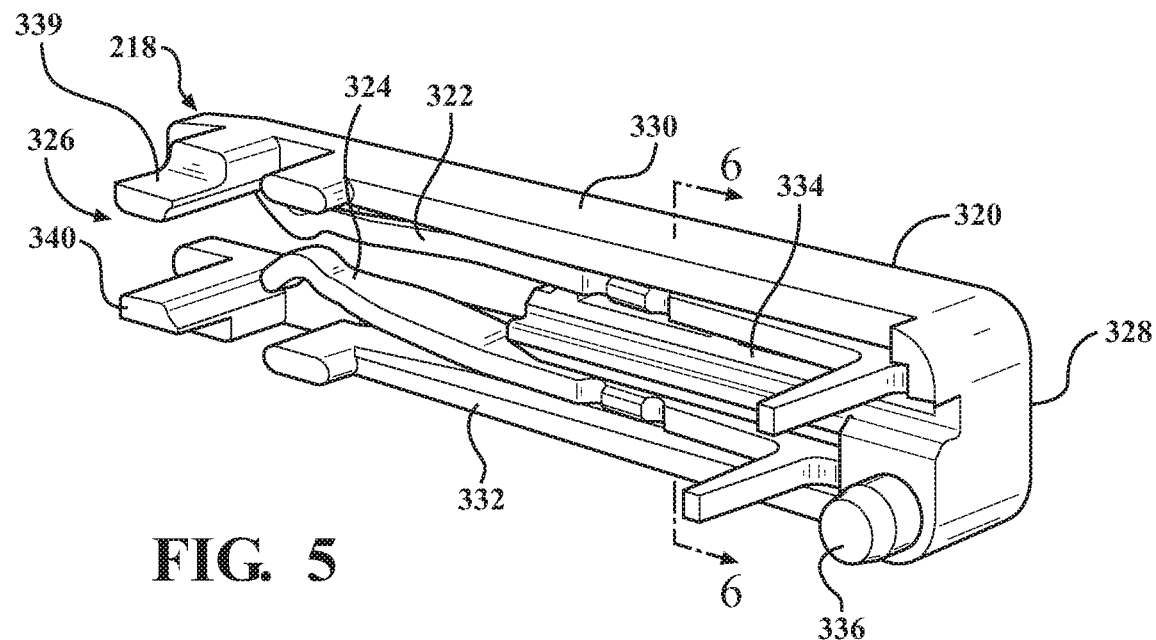
FIG. 5 is a perspective view that shows the connector assembly.

As shown in FIG. 5, which is a perspective view of the connector assembly 218, the first pin 322 is located in the housing 320 between the upper wall 330 and the intermediate wall 334, and the second pin 324 is located in the housing 320 between the lower wall 332 and the intermediate wall 334. An interior surface of the upper wall 330 serves as a datum surface for the first pin 322 to define a desired orientation for the first pin 322 relative to the housing 320. An interior surface of the lower wall 332 serves as a datum surface for the second pin 324 to define a desired orientation for the second pin 324 relative to the housing 320. Thus, the first pin 322 and the second pin 324 are located between the upper wall 330 and the lower wall 332, the first pin 322 is positioned adjacent to the upper wall 330, and the second pin 324 is positioned adjacent to the lower wall 332. Engagement of the first pin 322 with the upper wall 330 of the housing 320 limits deflection of the first pin 322 away from the second pin 324. Engagement of the second pin 324 with the lower wall 332 of the housing 320 limits maximum deflection of the second pin 324 away from the first pin 322.

The intermediate wall 334 is disposed between the first pin 322 and the second pin 324, and to separate the first pin 322 and the second pin 324, to define a desired spacing between the first pin 322 and the second pin 324 when no board is connected between them, to hold the first pin 322 against the interior surface of the upper wall 330, and to hold the second pin 324 against the interior surface of the lower wall 332. Ribs can be formed on the intermediate wall 334 and extend upward and downward from the intermediate wall for contacting the first pin 322 and the second pin 324. Engagement of the intermediate wall 334 of the housing 320, inclusive of the ribs, with the first pin 322 and the second pin 324 maintains the desired spacing between the first pin 322 and the second pin 324.

Figure 6:
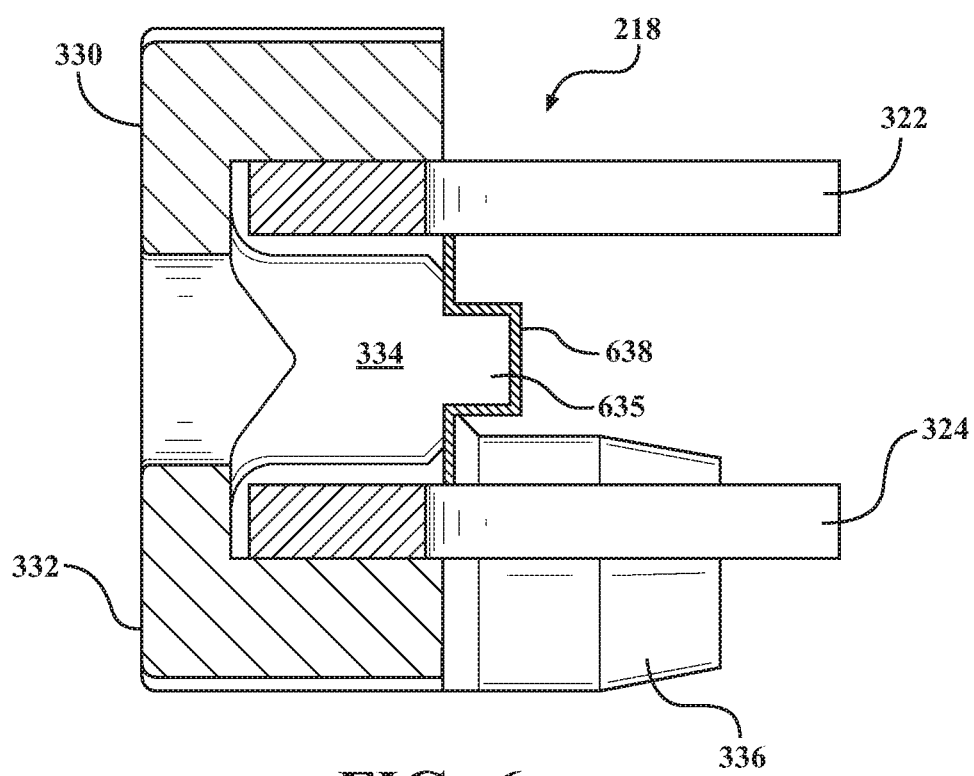
FIG. 6 is a cross section view of the connector assembly along a longitudinal direction toward the second end of the housing from the first end of the housing.

FIG. 6 is a cross section view of the connector assembly 218 along the longitudinal direction toward the second end 328 of the housing 320 from the first end 326 of the housing 320. A rib 635 is formed on the housing 320 and extends longitudinally along the intermediate wall 334. When the housing 320 is installed with respect to the main board 210, the rib 635 extends outward from the intermediate wall 334 toward the main board 210, and the rib 635 is positioned adjacent to the main board 210 but spaced slightly from the main board 210 such that the rib 635 does not touch the main board 210. By forming the rib 635 on the housing 320, the overall size of the connector assembly 218 can be reduced. In particular, the first pin 322 and the second pin 324 are designed to accommodate a certain voltage, which implies a certain minimum creepage distance between the first pin 322 and the second pin 324, which may be a larger distance than the required clearance distance. As an example, higher voltage applications require larger creepage distances relative to lower voltage applications, and the emitter 214 may require high voltage in implementations where the emitter is a laser, such as in implementations where the sensor assembly 100 is a LIDAR sensor assembly.

To place the first pin 322 and the second pin 324 close together, such that a straight-line distance between them is less than the creepage distance, the rib 635 is formed between them and extends laterally outward toward the main board 210 to define a creepage path 638 across the surface of the rib 635 that is longer than the straight-line distance between the first pin 322 and the second pin 324. In one example, the clearance (straight line) distance between the first pin 322 and the second pin 324 is less than one millimeter, and the required creepage distance is equal to or greater than one millimeter.

Figure 7:
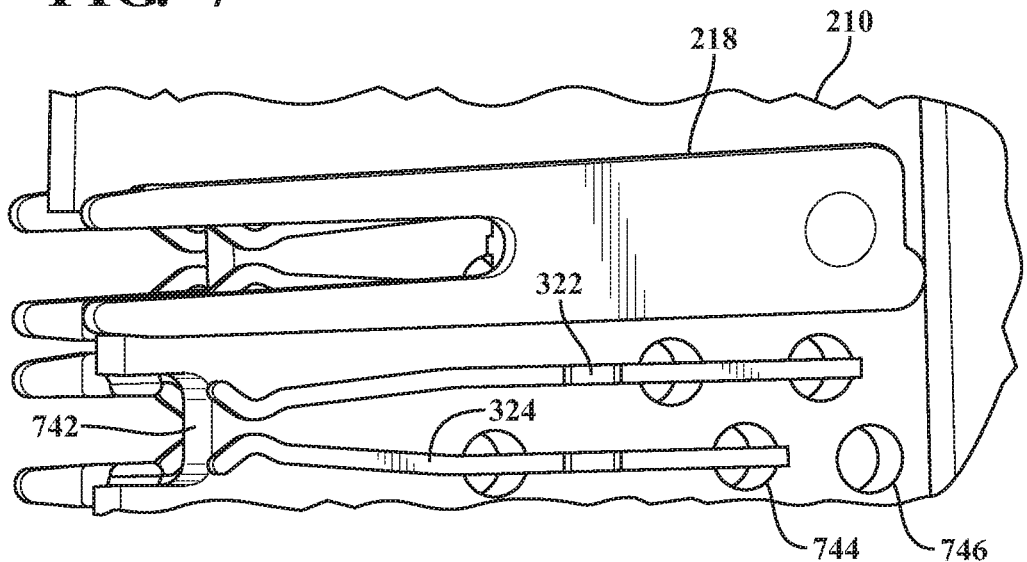
FIG. 7 is a perspective view showing part of the sensor assembly with a housing omitted from one of the connector assemblies to show connection of the first pin and the second pin to the main board of the sensor assembly.

FIG. 7 is a perspective view showing part of the sensor assembly 208 with a housing omitted from one of the connector assemblies 218 to show connection of the first pin 322 and the second pin 324 of to the main board 210. Notches 742 are formed on an edge of the main board 210 such that the first lateral projection 339 and the second lateral projection 340 of the housing 320 are disposed in the notches 742 and interaction of the first lateral projection 339 and the second lateral projection 340 of the housing 320 with the notches 742 limits rotation of the housing 320 relative to the main board 210. Thus, the notches 742 serve as features that are formed on the edge of the main board 210 for interaction with features formed on the housing 320 outward from the edge of the main board 210, such as the first lateral projection 339 and the second lateral projection 340, where the features of the housing 320 are engageable with the features of the main board 210 to align the angular orientation of the housing 320 relative to the main board 210.

Holes 744 are formed in the main board 210 for receiving the laterally extending portions 325a of the first pin 322 and the second pin 324, which are soldered in place with respect to the main board 210 to fix the first pin 322 and the second pin 324 with respect to the main board 210 and to connect the first pin 322 and the second pin 324 to electrical circuits that are located on the main board 210. In the illustrated example, four of the holes 744 are formed in the main board 210 and each is used to connect a different pin, including the first pin 322 and the second pin 324, to the main board 210.

An aperture 746 is formed through the main board 210 for receiving the mount 336 of the housing 320 to connect the housing 320 to the main board 210. The connection of the housing 320 to the main board 210 may allow for some degree of compliance during installation, such as a small degree of pivoting of the housing 320 relative to the main board 210 to allow alignment of the angular orientation of the housing 320 to be defined by interaction of features of the housing 320 with features of the main board 210.

To allow angular alignment of the housing 320 relative to the main board 210, in implementations where the mount 336 is a cylindrical post, the aperture 746 can be a circular aperture. The mount 336 can be disposed in the aperture 746 such that it can pivot relative to the main board 210 by rotation of the mount 336 within the aperture 746. In an alternative implementation, a cylindrical post can be formed on the main board 210, and a circular aperture can be formed in the housing 320, with the cylindrical post received in the circular aperture to allow pivoting of the housing 320 on the circular post relative to the main board 210.

Figure 8:
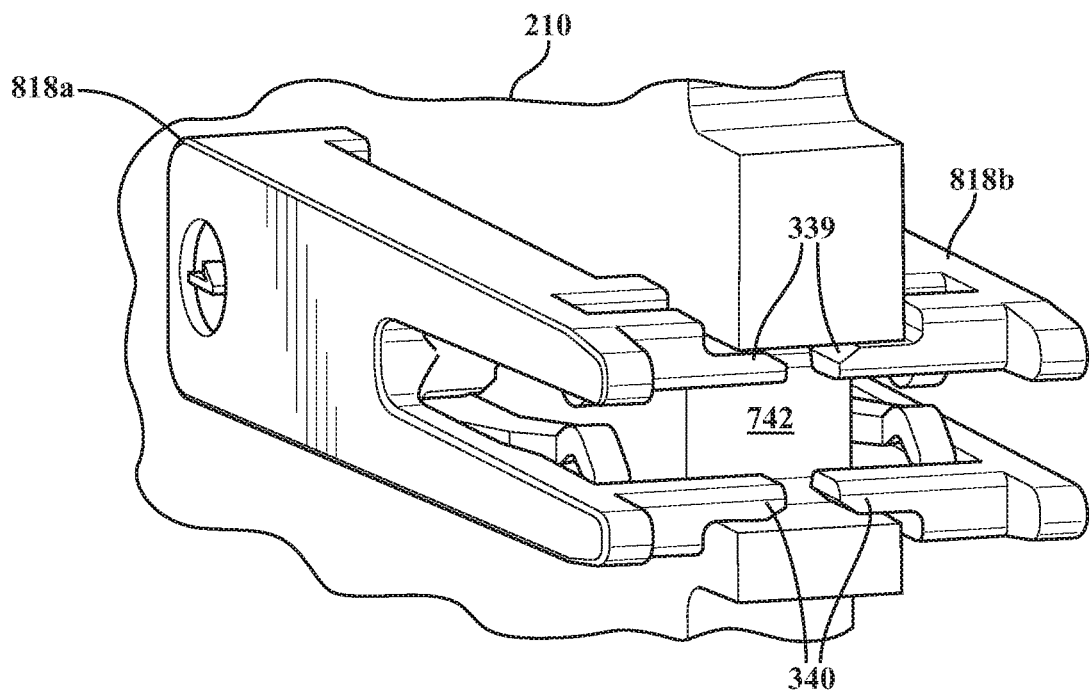
FIG. 8 is a perspective view showing a first connector assembly and a second connector assembly.

FIG. 8 is a perspective view showing a first connector assembly 818a and a second connector assembly 818b. The first connector assembly 818a and the second connector assembly 818b are analogous to the connector assembly 218. The first connector assembly 818a and the second connector assembly 818b are located on opposite sides of the main board 210 and are intended to be connected to a single one of the sensor component boards 212. The first lateral projection 339 and the second lateral projection 340 of the housing 320 of each of the first connector assembly 818a and the second connector assembly 818b are disposed in one of the notches 742 that is formed on the edge of the main board 210 to align the angular orientation of the first connector assembly 818a and the second connector assembly 818b and to limit deflections of portions of the housing 320 of each of the first connector assembly 818a and the second connector assembly 818b.

Figure 9:
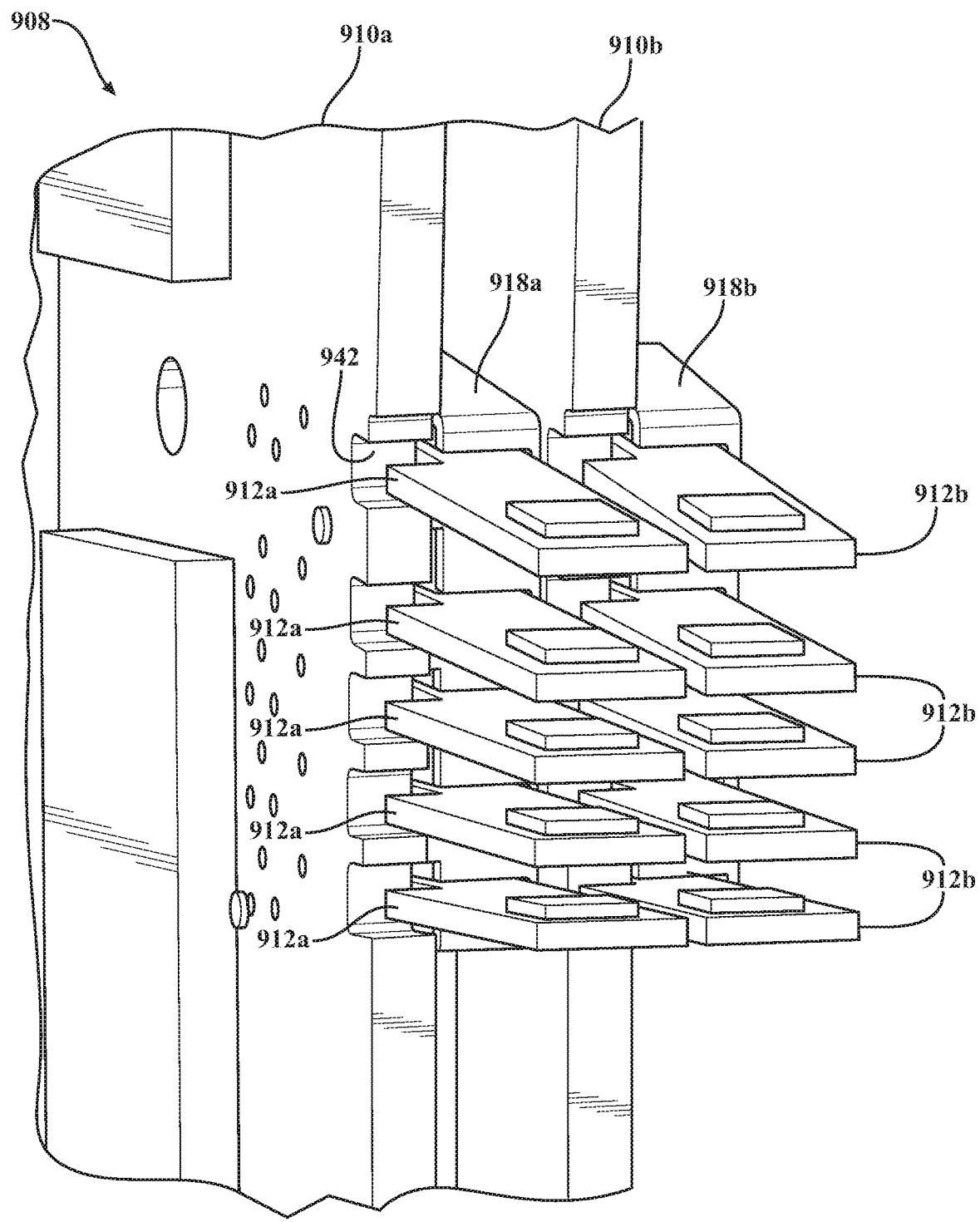
FIG. 9 is an illustration that shows sensor assemblies according to another embodiment.

FIG. 9 is an illustration that shows sensor assemblies 908 according to another embodiment. The sensor assemblies 908 can be incorporated in the sensor array 106 of the sensor unit 100, which may be a LIDAR sensor assembly as previously described. A first main board 910a and a second main board 910b are similar to the main board 210, as previously described. Each board from of a group of first sensor component boards 912a is connected to the first main board 910a, and each board from of a group of second sensor component boards 912b is connected to the second main board 910b. The first sensor component boards 912a and the second sensor component boards 912b can each include a sensor component, such as an emitter or a receiver as previously described.

A single connector assembly is provided on each of the first main board 910a and the second main board 910b. In the illustrated example, a first connector assembly 918a is connected to the first main board 910a and connects the first sensor component boards 912a to the first main board 910a, and a second connector assembly 918b is connected to the second main board 910b and connects the second sensor component boards 912b to the second main board 910b. Notches 942, which are similar to the notches 742, are formed on the first main board 910a and the second main board 910b to interact with features on the first connector assembly 918a, the second connector assembly 918b, the first sensor component boards 912a, and/or the second sensor component boards 912b in order to facilitate alignment of these components with respect to the first main board 910a and the second main board 910b.

The sensor component boards from of the group of the first sensor component boards 912a can each be oriented at a different angle relative to the first main board 910a. The angles of the first sensor component boards 912a can be determined by geometric features of portions of the first connector assembly 918a. In the illustrated example, the first sensor component boards 912a are disposed in a converging arrangement relative to one another. In the converging arrangement, for example, if the first sensor component boards 912a each include an emitter, the signals or beams (e.g., laser beams) generated by each first sensor component boards 912a would converge until reaching a crossing point and would then diverge. Alternatively, the first sensor component boards 912a could be disposed in a diverging arrangement. The sensor component boards from of the group of the second sensor component boards 912b can each be oriented at a different angle relative to the second main board 910b in a manner identical to that described for the first sensor component boards 912a.

Figure 10:
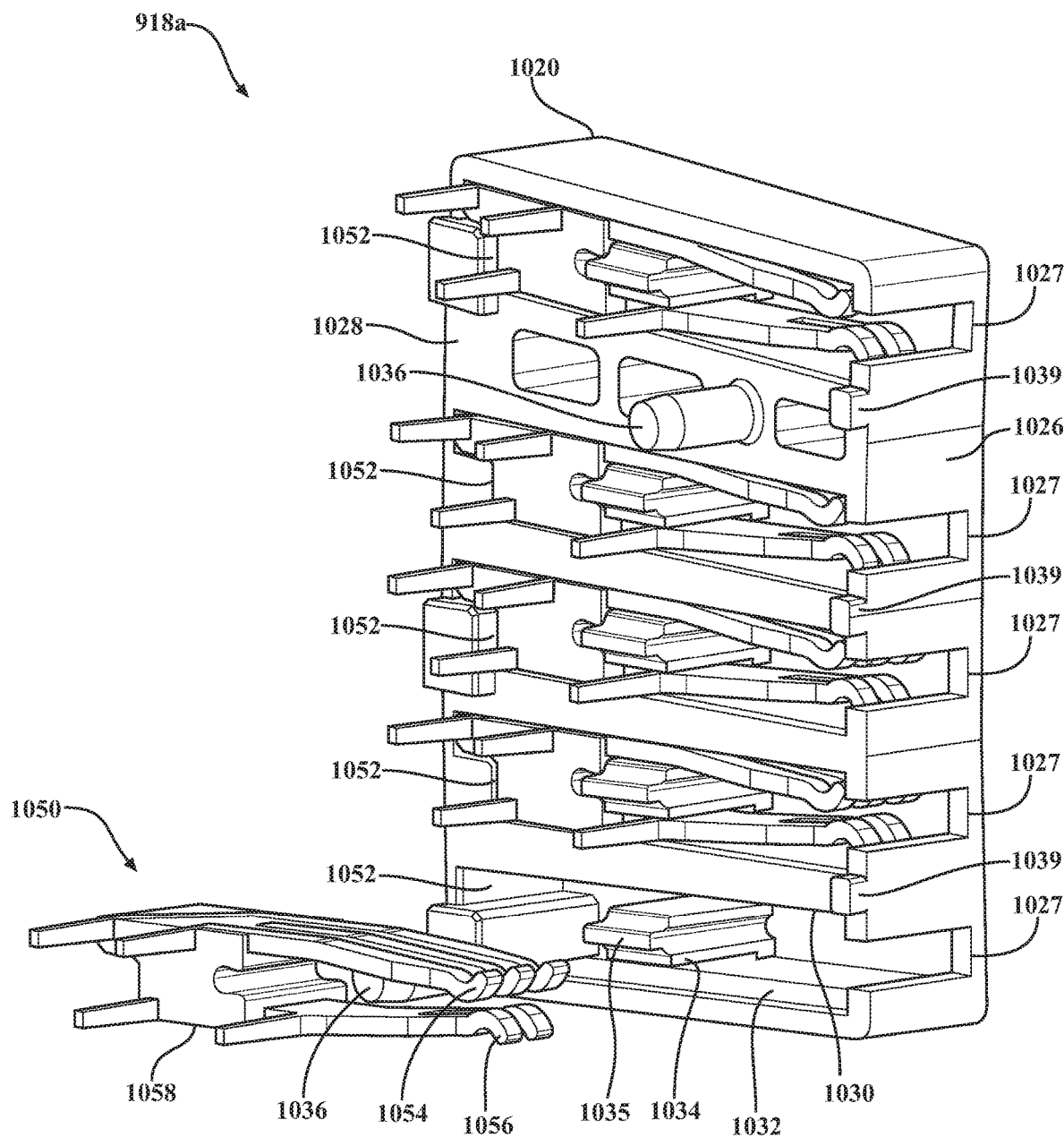
FIG. 10 is a perspective view showing a connector assembly from the sensor assemblies of FIG. 9 including a housing and pin assemblies, with one of the pin assemblies removed from the housing to show internal details of the housing.

FIG. 10 is a perspective exploded view showing the first connector assembly 918a including a housing 1020 and pin assemblies 1050, with one of the pin assemblies 1050 removed from the housing 1020 to show internal details of the housing 1020. The description made herein with respect to the first connector assembly 918a is also applicable to the second connector assembly 918b. The first connector assembly 918a is depicted without the first main board 910a of FIG. 9, but is connectable to the first main board 910a of FIG. 9, and certain features will be described relative to the first main board 910a.

The housing 1020 is a one-piece structure in the illustrated example, and can be formed from an insulating material such as plastic. The housing 1020 has a first end 1026 and a second end 1028. Slots 1027 are formed at the first end 1026 to allow insertion of the first sensor component boards 912a. The first sensor component boards 912a are engageable with the first main board 910a and the surfaces of the housing 1020 at the peripheries the slots 1027 to limit lateral motion of the first sensor component boards 912a relative to the housing, Lateral projections 1039 are formed on the housing 1020 near some or all of the slots 1027. The lateral projections 1039 function as standoffs to maintain a minimum distance between features located at the first end 1027 of the housing 1020 and the first main board 910a. The housing 1020 also includes mount posts 1036 that allow mounting to the first main board 910a and align the housing 1020 relative to the first main board 910a.

Internal bays 1052 are formed in the housing 1020. In the illustrated example, five of the internal bays 1052 are formed in the housing 1020. Each of the internal bays 1052 is configured to house one of the pin assemblies 1050 within it, and the internal bays 1052 include features that are adapted to support and align the pin assemblies 1050.

The slots 1027 are formed through the housing 1020 in equal number to the internal bays 1052 in order to provide access to the internal bays 1052 from outside of the housing 1020, such that the first sensor component boards 912a can extend into the housing 1020 through the slots 1027.

The internal bays 1052 may be angled differently than one another to define differing angles for sensor component boards, such as the first sensor component boards 912a. Thus, for example, the internal bays 1052 can be oriented to define the converging arrangement or the diverging arrangement, as previously described.

Each internal bay 1052 has an upper internal wall 1030, a lower internal wall 1032 and an intermediate wall 1034. These components function according to the descriptions of analogous components of the housing 320, namely the upper wall 330, the lower wall 332, and the intermediate wall 334. A rib 1035 is formed on and extends laterally outward from the intermediate wall 1034 toward the first main board 910a. The rib 1035 functions to increase creepage distance, as described with respect to the rib 635.

The pin assembly 1050 includes multiple spring finger contact pins, such as upper pins 1054 and lower pins 1056. In the illustrated example, there are three of the upper pins 1054 and there are two of the lower pins 1056. The first sensor component boards 912a are mechanically and electrically connected to the first main board 910 by the pin assemblies 1050, by engagement of opposed pairs of pins with the first sensor component boards 912a. In particular, the first sensor component boards 912a are each connected to the first main board 910a by a respective one of the pin assemblies 1050. Each of the first sensor component boards 912a has an upper surface, and each of the first sensor component boards 912a has a lower surface. Connection of the first sensor component boards 912a to the main board 910 is established by engagement of the upper pins 1054 of each of the pin assemblies 1050 with an upper surface of a respective one of the first sensor component boards 912a, and by engagement of the lower pins 1056 of each of the pin assemblies 1050 with a lower surface of the respective one of the first sensor component boards 912a.

In one implementation, the upper pins 1054 and the lower pints 1056 supply power to the first sensor component boards 912a and allow for transmission of signals and/or data. In another implementation, the upper pins 1054 and the lower pins 1056 are used to secure each of the first sensor component boards 912a, but not all of the pins are used as power and/or signal connectors for each of the first sensor component boards 912a. Thus, for instance, the upper pins 1054 can be used to receive signals from the first sensor component boards 912a that include receivers by electrical connection of the upper pins 1054 to circuits on the first main board 910a, while the lower pins 1056 serve only to hold the first sensor component board 912a in place. With respect to the first sensor component boards 912a that include an emitter, a high voltage power connection from the first main board 910a to the first sensor component boards 912a can be made using the lower pins 1056, while the upper pins 1054 serve only to hold the first sensor component board 912a in place.

The pin assembly 1050 includes a base part 1058 that joins the upper pins 1054 and the lower pins 1056 together in a single unit. The base part 1058 is formed of an insulating material to resist inadvertent electrical contacts between the upper pins 1054 and the lower pins 1056. Interconnecting the upper pins 1054 and the lower pins 1056 using the base part 1058 allows, for example, installation of the upper pins 1054 and the lower pins 1056 with respect to the first main board 910a together, with the relative alignments of the upper pins 1054 and the lower pins 1056 being previously fixed in place by installation of the base part 1058 with respect to the upper pins 1054 and the lower pins 1056.

Figure 11:
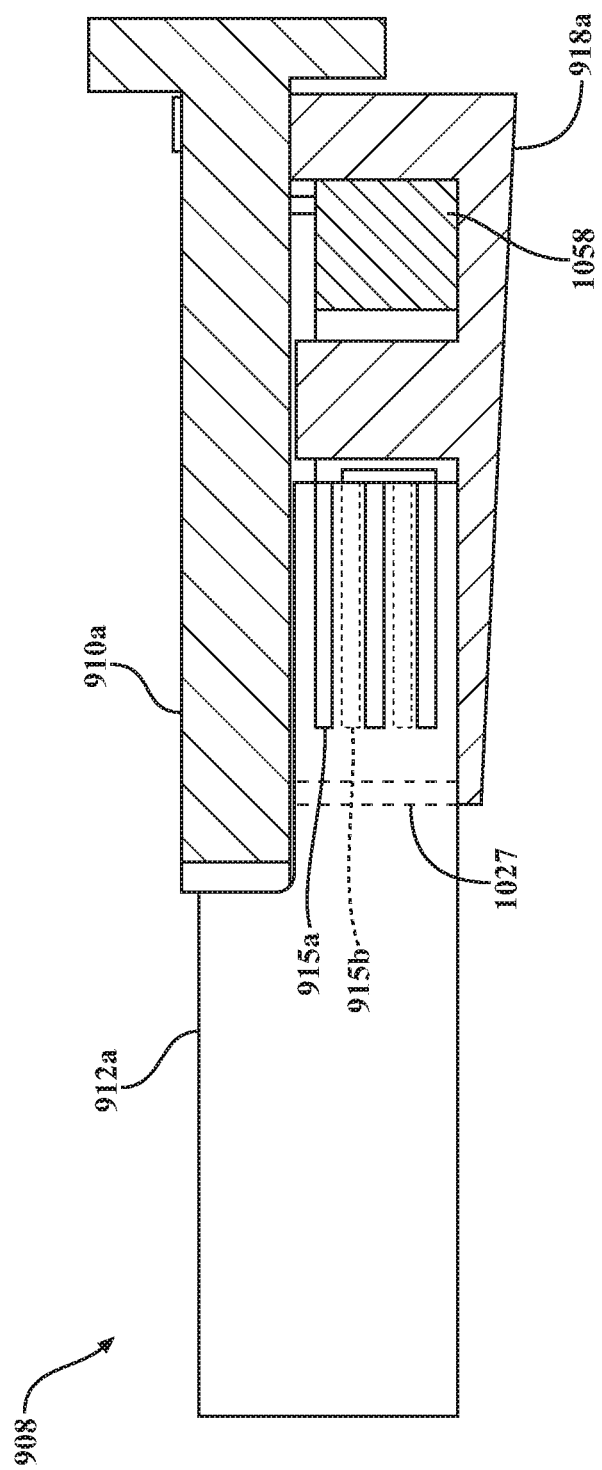
FIG. 11 is a cross section view of the one of the sensor assemblies of FIG. 9 taken through the housing of the connector assembly and showing a sensor component board that is connected to the connector assembly.

When the pin assemblies 1050 are installed in respective ones of the internal bays 1052 of the housing 1020, an upper internal wall 1030 and a lower internal wall 1032 are engageable with the upper pins 1054 and the lower pins 1056 to limit deflection of the upper pins 1054 and the lower pins 1056 from respective neutral positions. The intermediate wall 1034 separates the upper pins 1054 and the lower pins 1056 when they are in a disconnected position relative to the first sensor component boards 912a. The intermediate wall also holds the upper pins 1054 in engagement with the upper internal wall 1030 and holds the lower pins 1056 in engagement with the lower internal wall FIG. 11 is a cross section view of one of the sensor assemblies 908 looking downward through the first main board 910a and the housing 1020 of the first connector assembly 918a and showing one of the first sensor component boards 912a that is connected to the first connector assembly 918a. The first sensor component board 912a includes upper contact pads 915a that are located on the upper surface of the first sensor component board 912a for engagement with and electrical connection to the upper pins 1054. The first sensor component board 912a includes lower contact pads 915b that are located on the lower surface of the first sensor component board 912a for engagement with and electrical connection to the lower pins 1056. In the illustrated example, the first sensor component board 912a includes three of the upper contact pads 915a and two of the lower contact pads 915b, to match the numbers of the upper pins 1054 and the lower pins 1056.

Lateral positioning of the first sensor component board 912a is achieved by a small lateral tolerance for the slots 1027, which restrains the lateral position of the first sensor component board 912a by engagement with surfaces of the housing 1020 around the slots 1027 and opposite the first main board 910a, and by engagement with the first main board 910a opposite the housing 1020.

What is claimed is:

1. A LIDAR sensor assembly, comprising:
a main board that has an edge;

a board-to-board connector assembly that is located on the main board and includes:
  a housing connected to the main board, wherein the housing includes a feature that aligns an angular orientation of the housing relative to the main board by engagement of the feature of the housing with the edge of the main board, and
  connector pins that are connected to the main board and are disposed within the housing; and
a sensor component board that is connected to the main board by engagement of the connector pins of the board-to-board connector assembly with an upper circuit board surface and a lower circuit board surface of the sensor component board to allow pivoting of the sensor component board relative to the main board over a limited angular range.

2. The LIDAR sensor assembly of claim 1, wherein the connector pins of the board-to-board connector assembly are engageable with the housing to limit pivoting of the sensor component board relative to the main board to the limited angular range.

3. The LIDAR sensor assembly of claim 2, wherein the feature formed on the housing of the board-to-board connector assembly is defined on a portion of the housing that extends outward past the edge of the main board to align the angular orientation of the housing relative to the main board by engagement with the edge of the main board.

4. The LIDAR sensor assembly of claim 1, wherein the connector pins of the board-to-board connector assembly each include a main portion and a laterally extending portion that is connected to the main board such that the main portion of each of the connector pins of the board-to-board connector assembly is spaced from the main board by the laterally extending portion of the connector pin.

5. The LIDAR sensor assembly of claim 1, wherein:
  the housing of the board-to-board connector assembly includes a first wall,
  the housing of the board-to-board connector assembly includes a second wall,
  the connector pins of the board-to-board connector assembly are located between the first wall and the second wall,
  the connector pins of the board-to-board connector assembly include a first pin that is positioned adjacent to the first wall, and
  the connector pins of the board-to-board connector assembly include a second pin that is positioned adjacent to the second wall.

6. The LIDAR sensor assembly of claim 5, wherein:
  the housing of the board-to-board connector assembly includes an intermediate wall that is located between the first pin and the second pin to define a spacing between the first pin and the second pin,
  engagement of the first pin with the first wall of the housing of the board-to-board connector assembly limits deflection of the first pin away from the second pin, and
  engagement of the second pin with the second wall of the housing of the board-to-board connector assembly limits maximum deflection of the second pin away from the first pin, and
  engagement of the intermediate wall of the housing of the board-to-board connector assembly with the first pin and the second pin maintains the spacing between the first pin and the second pin.

7. The LIDAR sensor assembly of claim 6, wherein a rib is formed on the intermediate wall of the housing of the board-to-board connector assembly between the first pin and the second pin and the rib extends toward the main board from the housing of the board-to-board connector assembly.

8. A LIDAR sensor assembly, comprising:
a main board;
a board-to-board connector assembly that is located on the main board and includes:
  a housing that is connected to the main board, wherein an internal bay is defined inside the housing, the internal bay has an upper internal wall, the internal bay has a lower internal wall, and the internal bay has an intermediate wall, and
  a pin assembly that is connected to the main board and is disposed within the housing, wherein the pin assembly includes upper pins, the pin assembly includes lower pins, the upper pins are positioned adjacent to the upper internal wall, and the lower pins are positioned adjacent to the lower internal wall, and the intermediate wall is positioned between the upper pins and the lower pins so that engagement of the intermediate wall with the upper pins and the lower pins maintains a spacing between the upper pins and the lower pins; and
a sensor component board that is connected to the main board by the pin assembly of the board-to-board connector assembly, wherein the sensor component board has an upper surface, the sensor component board has a lower surface, the upper pins engage the upper surface of the sensor component board, and the lower pins engage the lower surface of the sensor component board.

9. A LIDAR sensor assembly, comprising:
a main board that has an edge;
a board-to-board connector assembly that is located on the main board and includes:
  a housing connected to the main board, wherein an internal bay is defined inside the housing, and
  connector pins that are connected to the main board and are disposed within the internal bay of the housing; and
a sensor component board that is connected to the main board by the connector pins of the board-to-board connector assembly to allow pivoting of the sensor component board relative to the main board over a limited angular range, wherein a slot is formed through the housing of the board-to-board connector assembly to provide access to the internal bay, and the sensor component board extends into the housing of the board-to-board connector assembly through the slot.

10. The LIDAR sensor assembly of claim 9, wherein:
the sensor component board is engageable with the main board and the housing of the board-to-board connector assembly at the slot to limit lateral motion of the sensor component board relative to the housing.

11. The LIDAR sensor assembly of claim 8, wherein:
the upper internal wall of the housing of the board-to-board connector assembly limits deflection of the upper pins away from the lower pins,
the lower internal wall of the housing of the board-to-board connector assembly limits deflection of the lower pins away from the upper pins, and
the intermediate wall separates the upper pins and the lower pins.

12. The LIDAR sensor assembly of claim 8, wherein:
a rib is formed on the intermediate wall of the housing of the board-to-board connector assembly, and the rib extends laterally outward from the intermediate wall of the housing of the board-to-board connector assembly toward the main board.

13. The LIDAR sensor assembly of claim 8, wherein:
the housing of the board-to-board connector assembly is a one-piece structure, and
the housing of the board-to-board connector assembly is formed from an insulating material.

14. The LIDAR sensor assembly of claim 8, wherein:
the pin assembly of the board-to-board connector assembly includes a base part that interconnects the upper pins and the lower pins, and
the base part of the pin assembly is formed from an insulating material.

15. The LIDAR sensor assembly of claim 8, wherein:
the main board has an edge,
a notch is formed on the edge of the main board,
a feature is formed on the housing of the board-to-board connector assembly, and
engagement of the feature with the notch aligns the housing with respect to the main board.

16. The LIDAR sensor assembly of claim 8, wherein:
the main board has an edge,
a notch is formed on the edge of the main board,
a feature is formed on the sensor component board, and
engagement of the feature with the notch aligns the sensor component board with respect to the main board.

17. The LIDAR sensor assembly of claim 8, wherein the sensor component board is a first sensor component board from a group of sensor component boards that are connected to the main board by the board-to-board connector assembly.

18. The LIDAR sensor assembly of claim 8, wherein the sensor component board includes at least one of an emitter or a receiver.

19. A LIDAR sensor assembly, comprising:
a main board;
a board-to-board connector assembly that is located on the main board and includes:
a housing that is connected to the main board, wherein internal bays are defined inside the housing, each of the internal bays has an upper internal wall, and each of the internal bays has a lower internal wall, and
pin assemblies that are connected to the main board and are each disposed within the housing in a respective one of the internal bays, wherein each of the pin assemblies includes upper pins, each of the pin assemblies includes lower pins, the upper pins are positioned adjacent to the upper internal wall of the respective one of the internal bays so that engagement with the upper internal wall limits deflection of the upper pins away from the lower pins, and the lower pins are positioned adjacent to the lower internal wall of the respective one of the internal bays so that engagement with the lower internal wall limits deflection of the lower pins away from the upper pins; and
sensor component boards that are each connected to the main board by a respective one of the pin assemblies of the board-to-board connector assembly.

20. The LIDAR sensor assembly of claim 19, wherein:
slots are formed through the housing of the board-to-board connector assembly to provide access to the internal bays,
the sensor component boards each extend into the housing of the board-to-board connector assembly through a respective one of the slots,
the sensor component boards are engageable with the main board and the housing of the board-to-board connector assembly at the slots to limit lateral motion of the sensor component boards relative to the housing,
the housing of the board-to-board connector assembly is a one-piece structure, and
the housing of the board-to-board connector assembly is formed from an insulating material.

21. The LIDAR sensor assembly of claim 19, wherein:
each of the internal bays of the housing of the board-to-board connector assembly has an intermediate wall that separates the upper pins of the respective one of the pin assemblies and the lower pins of the respective one of the pin assemblies,
ribs are formed on a respective intermediate wall of each of the internal bays of the housing of the board-to-board connector assembly,
the ribs each extend laterally outward from the respective intermediate wall of each of the internal bays of the housing of the board-to-board connector assembly toward the main board,
the pin assemblies of the board-to-board connector assembly each include a base part that interconnects the upper pins and the lower pins, and
the base parts of the pin assemblies are each formed from an insulating material.

22. The LIDAR sensor assembly of claim 19, wherein the sensor component boards each include at least one of an emitter or a receiver.

23. The LIDAR sensor assembly of claim 19, wherein each of the sensor component boards has an upper circuit board surface, each of the sensor component boards has a lower circuit board surface, the upper pins of each of the pin assemblies engage the upper circuit board surface of the respective one of the sensor component boards, and the lower pins of each of the pin assemblies engage the lower circuit board surface of the respective one of the sensor component boards.

* * * * *